(12) United States Patent
Ahmed et al.

(10) Patent No.: US 7,005,359 B2
(45) Date of Patent: Feb. 28, 2006

(54) BIPOLAR JUNCTION TRANSISTOR WITH IMPROVED EXTRINSIC BASE REGION AND METHOD OF FABRICATION

(75) Inventors: Shahriar Ahmed, Portland, OR (US); Ravindra Soman, Portland, OR (US); Anand Murthy, Portland, OR (US); Mark Bohr, Aloha, OR (US)

(73) Assignee: Intel Corporation, Santa Clara, CA (US)

(*) Notice: Subject to any disclaimer, the term of this patent is extended or adjusted under 35 U.S.C. 154(b) by 72 days.

(21) Appl. No.: 10/715,971

(22) Filed: Nov. 17, 2003

(65) Prior Publication Data

US 2005/0104160 A1    May 19, 2005

(51) Int. Cl.
*H01L 21/331* (2006.01)
(52) U.S. Cl. .................. 438/366; 438/365; 438/368
(58) Field of Classification Search ................ 438/361, 438/364–369, 347–350, 312, 345, 374, 309 438/313, 320–321, 343
See application file for complete search history.

(56) References Cited

U.S. PATENT DOCUMENTS

| | | | |
|---|---|---|---|
| 5,250,448 A | 10/1993 | Hamasaki et al. | |
| 6,541,336 B1 | 4/2003 | Cantell et al. | |
| 6,617,220 B1 * | 9/2003 | Dunn et al. | 438/309 |
| 6,649,482 B1 * | 11/2003 | Naem | 438/361 |
| 2002/0027232 A1 | 3/2002 | Shigematsu et al. | |
| 2002/0132438 A1 | 9/2002 | Dunn et al. | |
| 2002/0197783 A1 | 12/2002 | Ahlgren et al. | |
| 2003/0136975 A1 | 7/2003 | Coolbaugh et al. | |

FOREIGN PATENT DOCUMENTS

| | | |
|---|---|---|
| DE | 101 04 776 A1 | 8/2002 |
| EP | 1 394 861 A3 | 3/2004 |
| EP | 1 489 662 A2 | 12/2004 |

OTHER PUBLICATIONS

Ida, Minoru et al., "Enhancement of fmax in InP/InGaAs HBT's by Selective MOCVD Growth of Heavily-Doped Extrinsic Base Regions," IEEE Trans on Elect Devices, vol. 43, No. 11, Nov 1996, pp. 1812-1817.

* cited by examiner

*Primary Examiner*—David Blum
*Assistant Examiner*—Thanhha Pham
(74) *Attorney, Agent, or Firm*—Blakely, Sokoloff, Taylor & Zafman LLP

(57) ABSTRACT

A bipolar transistor and its fabrication are described. The extrinsic base region is formed by growing a second, more heavily doped, epitaxial layer over a first epitaxial layer. The second layer extends under, and is insulated from, an overlying polysilicon emitter pedestal.

15 Claims, 6 Drawing Sheets

BIPOLAR JUNCTION TRANSISTOR WITH IMPROVED EXTRINSIC BASE REGION AND METHOD OF FABRICATION

FIELD OF THE INVENTION

This invention relates to the field of bipolar transistors.

PRIOR ART

In the design and fabrication of bipolar transistors, especially high performance bipolar junction transistors, the design and fabrication of the base region is particularly critical to the performance of the transistor.

Often increased performance is achieved through a reduction in the intrinsic base width. This, however, inevitably increases the intrinsic and link base resistances. If intrinsic base resistance is reduced by the incorporation of additional dopant in this region, there is an increase in the width of the intrinsic base with a corresponding degradation in performance. Thus, it is often difficult to increase performance with changes to only the intrinsic base region.

Increased performance can also be obtained by decreasing the resistance in the extrinsic base region. Typically, the extrinsic base region is formed by ion implantation of a dopant which is activated thermally. This presents its own problems including unwanted lateral diffusion and the need for high temperature processing. Problems associated with the prior art ion implantation of the extrinsic base region are discussed in conjunction with FIG. 1.

DETAILED DESCRIPTION

In the following description, a method for fabricating a bipolar transistor and its structure are described. Numerous specific details are set forth, such as specific doping levels, in order to provide a thorough understanding of the present invention. It will be apparent to one skilled in the art that the present invention may be practiced without these specific details. In other instances, well-known processing used in the fabrication of semiconductor integrated circuits is not described in detail, in order not to unnecessarily obscure the present invention. Moreover, in the following description, the formation and structure of an NPN transistor is described. It will be apparent to one skilled in the art that the description is applicable to the formation of a PNP transistor.

Figure 1:
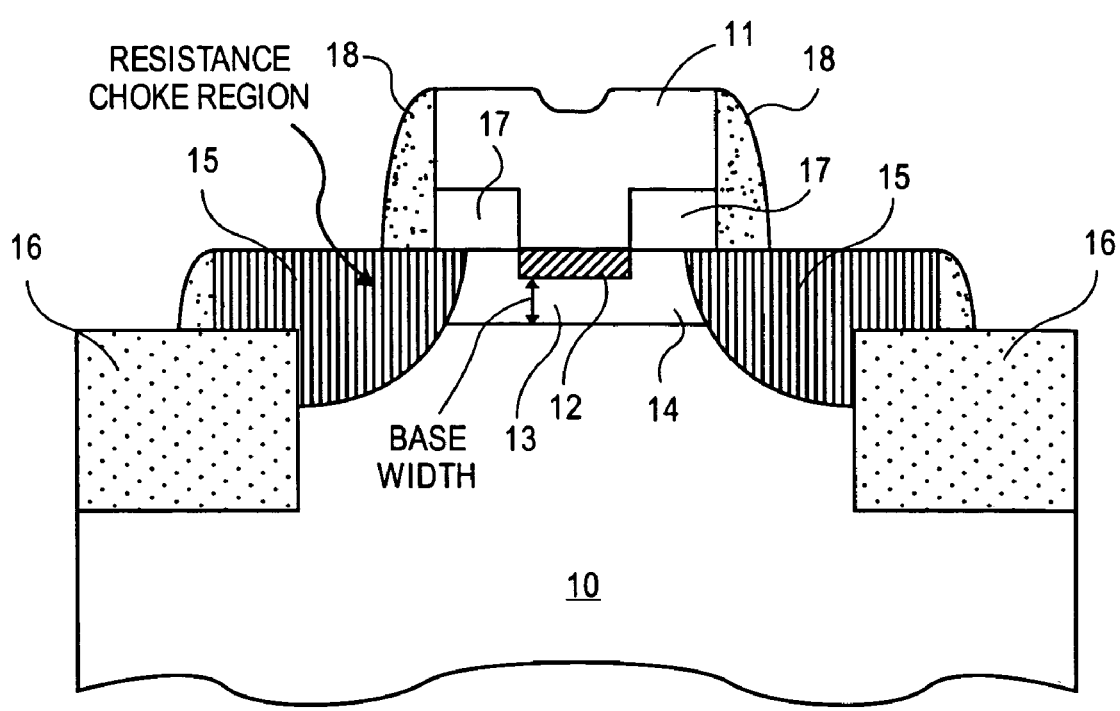
FIG. 1 is a cross-sectional, elevation view of a prior art bipolar junction transistor.

Before describing an embodiment of the present invention, problems associated with prior art, bipolar transistors are described in conjunction with FIG. 1.

In FIG. 1, the collector of an NPN transistor is formed in a substrate 10. The substrate comprises a monocrystalline silicon substrate doped with an N type dopant. The transistor is formed between two isolation regions 16 formed in the substrate 10.

In the formation of the transistor of FIG. 1, an epitaxial layer is grown on the substrate 10. This layer may be a silicon-germanium layer. Then, the base and emitter regions for the transistor are formed in this layer. The base region of the transistor comprises the intrinsic base region 13, the link base region 14, and the extrinsic base region 15.

The emitter region 12 is produced by defining an opening in an oxide layer 17, forming a doped polysilicon emitter pedestal 11 and driving dopant from the pedestal to produce an emitter region 12.

After the emitter is formed, boron, for instance, is ion implanted in alignment with the spacers 18 to reduce the resistance of the extrinsic base region 15.

A number of problems are associated with this ion implantation. First, the implanted dopant cannot be activated sufficiently. Secondly, some damage is introduced into the intrinsic base region because of the ion implantation, thereby restricting the formation of a high quality intrinsic base region 13. Thirdly, margins need to be built into the dimensions to provide for critical dimensions and registration. This increase in the length of the extrinsic base and overall size of the transistor. The larger size increases the base and collector resistance and the base-collector and the collector-to-substrate capacitance. Consequently, the performance, especially the maximum oscillation frequency $F_{max}$, degrades. Finally, severe thermal restrictions are imposed because of the relatively high temperatures needed to activate the dopant. The inevitable lateral diffusion reduces the lateral abruptness of the heavily doped extrinsic base region 15, thereby increasing the resistance even at a relatively high doping level.

As will be seen, the present invention decreases the resistance in the key points of the extrinsic and link base regions, thereby increasing $F_{max}$ and the overall noise performance without impacting the devices cutoff frequency ($F_t$).

Figure 2:
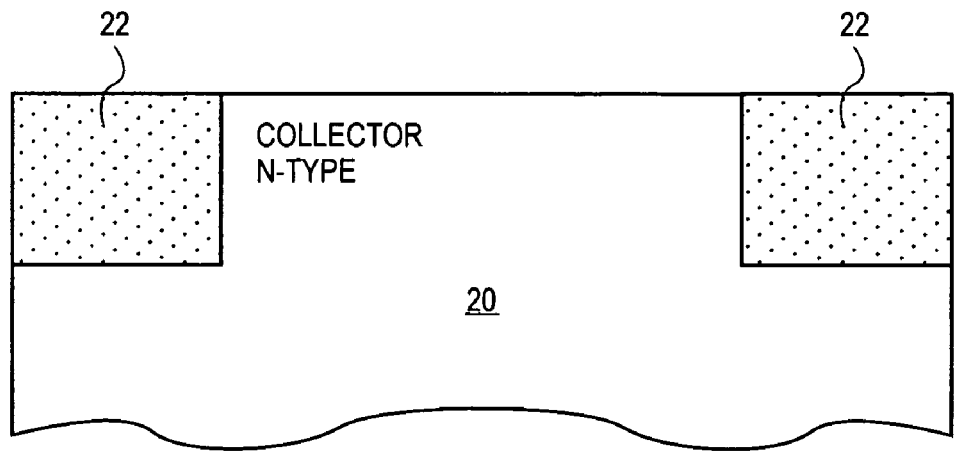
FIG. 2 illustrates a cross-sectional, elevation view of a monocrystalline silicon substrate with spaced-apart isolation regions.

The initial fabrication of a transistor for one embodiment of the present invention begins in a similar manner as with the prior art. First, a pair of spaced-apart isolation regions 22 are fabricated in a monocrystalline silicon substrate 20, as shown in FIG. 2. The isolation regions 22 may be oxide filled trenches. The substrate 20 is doped with an N type dopant for the described embodiment to define a collector region for the transistor.

Figure 3:
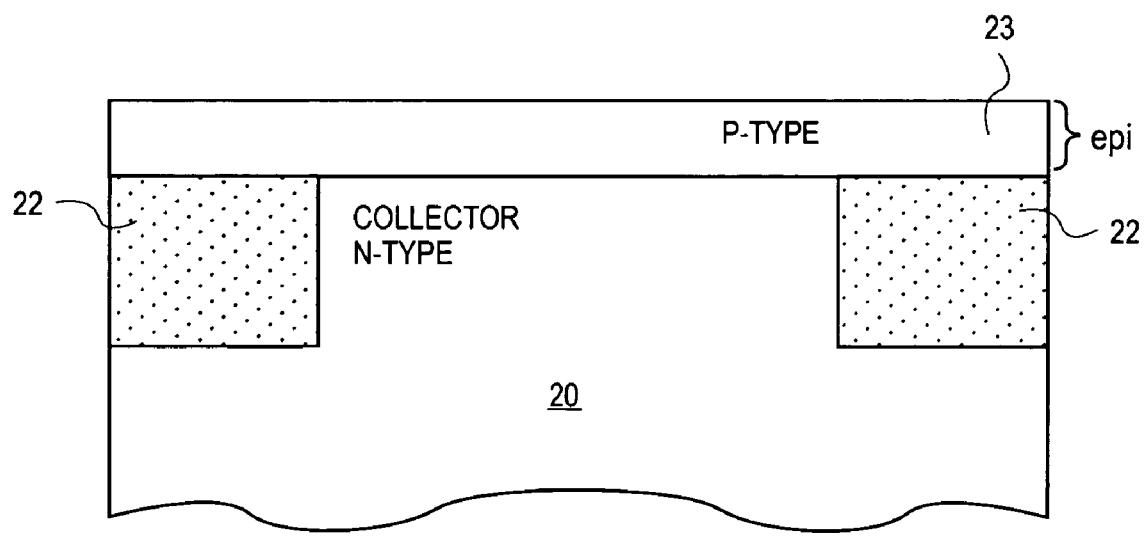
FIG. 3 illustrates the substrate of FIG. 2 after an epitaxial layer has been grown.

Next, as shown in FIG. 3, an epitaxial layer 23 is grown on the substrate 20. An ordinary epitaxial layer approximately 1,000 Å thick is grown, for one embodiment. Layer 23 is doped with, for instance, boron. The dopant profile in the layer 23 provides for more dopant in the lower regions of the layer and less dopant in the upper regions of the layer. The P type dopant for this profile may have a doping level of, for instance, approximately $10^{18}$–$10^{19}$ atoms cm$^{-3}$ as its peak doping level. The monocrystalline layer 23, in one embodiment, comprises silicon-germanium.

Figure 4:
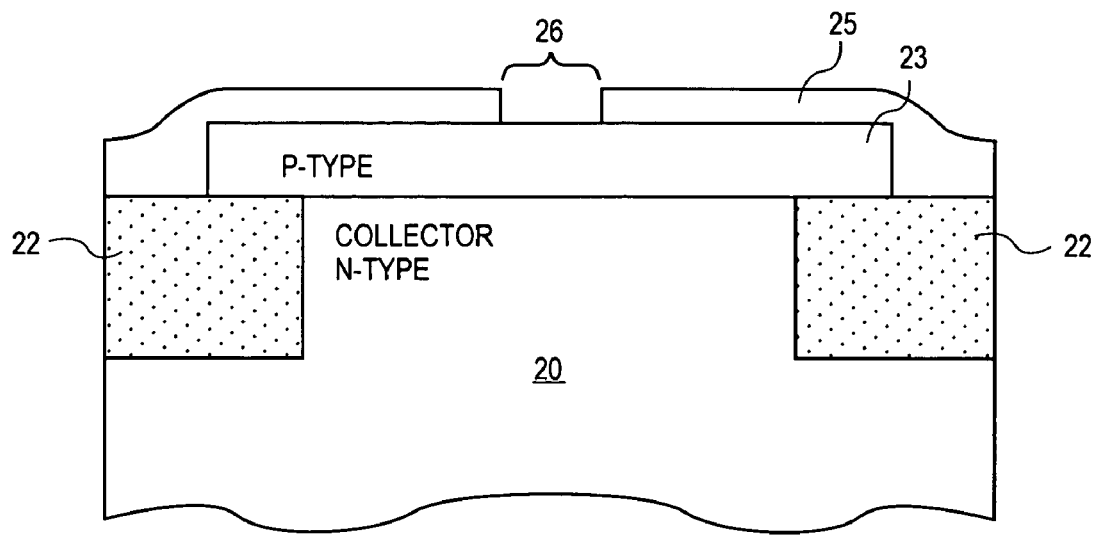
FIG. 4 illustrates the substrate of FIG. 3 after patterning of the epitaxial layer and the formation and patterning of an overlying oxide layer.

Now, as shown in FIG. 4, the layer 23 is patterned to form a epitaxial layer 23 covering an area which is limited to a single transistor. (The number used to identify a layer is also used to designate a part of that layer that remains after etching or patterning. Thus, the number "23" is used to designate the layer before etching and the portion of the layer remaining after etching.) Only one dimension of the layer 23 is shown in the cross-sectional view of FIG. 4. It will be appreciated that the layer 23 and other layers are also patterned in a second dimension.

After the layer 23 has been etched, an oxide layer 25, which may be a chemical vapor deposited (CVD) silicon dioxide layer is deposited over the substrate. The oxide layer 25 is patterned to obtain an opening 26, which enables the fabrication of an emitter region in the layer 23, as will be seen. By way of example, the opening 26 may be 1,000 Å across.

Figure 5:
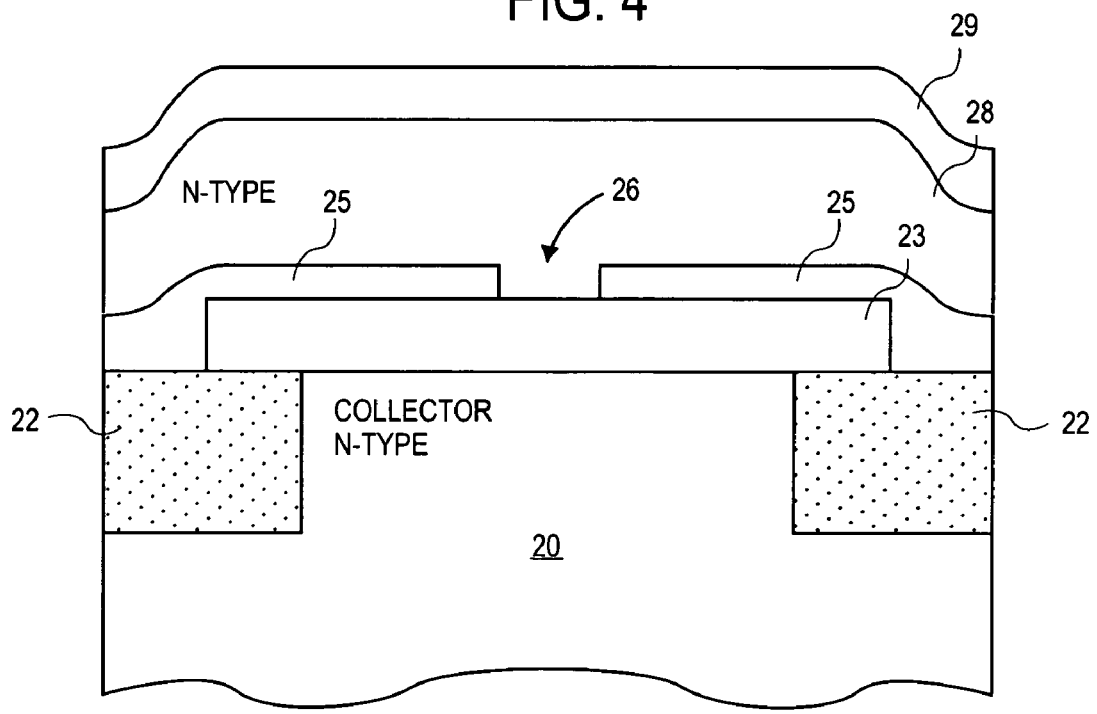
FIG. 5 illustrates the substrate of FIG. 4 after the deposition of a polysilicon layer and a hard mask layer.

A polysilicon layer 28, for instance, 1,700–2,000 Å thick, is now deposited over the structure of FIG. 4, as shown in FIG. 5. The polysilicon layer 28 is doped with an N type dopant, such as arsenic, as it is deposited or by ion implantation of an N type dopant after its deposition. A layer 29 used to form a hard mask is then deposited over layer 28. A material such as silicon nitride may be used for layer 29. The layer 29 is patterned into a mask, which is used to define the pedestal 28 of FIG. 6. Additionally, the underlying oxide layer 25 is patterned so that the pedestal rests on the oxide regions 25 shown in FIG. 6.

Figure 6:
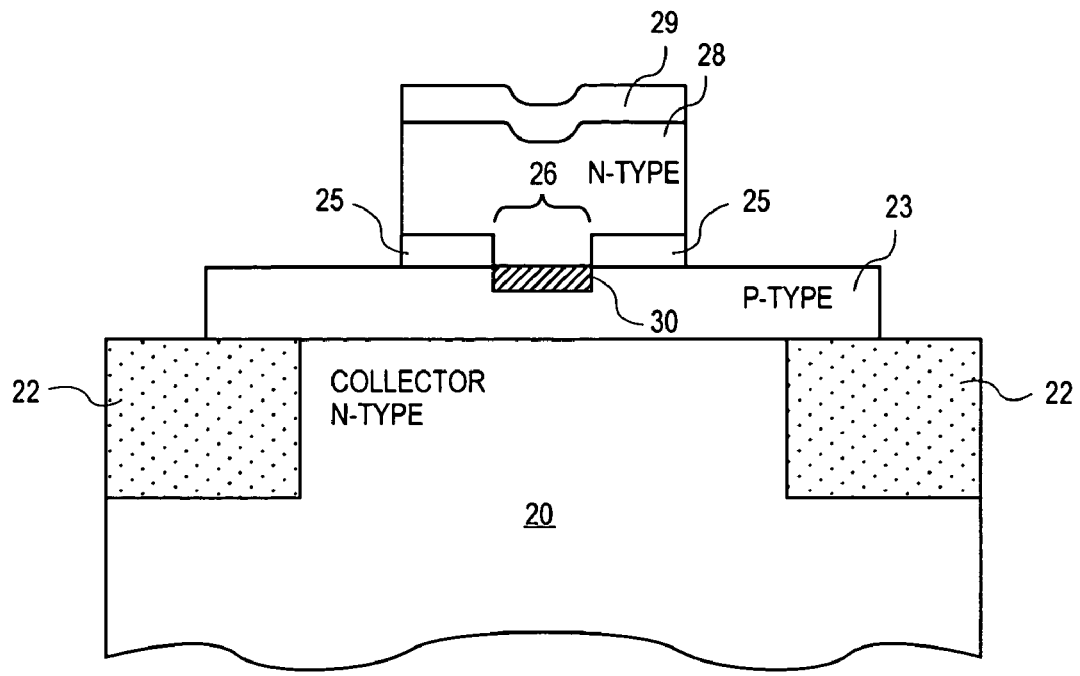
FIG. 6 illustrates the substrate of FIG. 5 after the formation of a emitter pedestal and the formation of an emitter region in the epitaxial layer.

The dopant from the pedestal 28 is driven into the epitaxial layer 23 to define the N type emitter region 30 of FIG. 6. An ordinary thermal process is used. Typically, the intrinsic base region width remaining in the layer 28 is 700–800 Å after the emitter region is formed.

Figure 7:
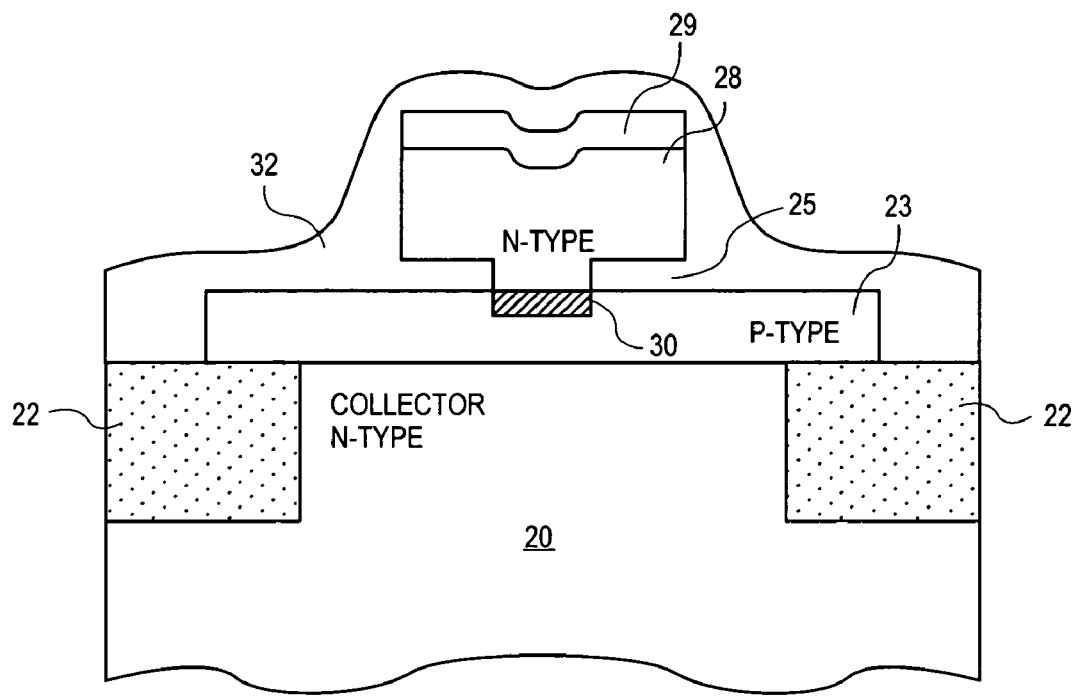
FIG. 7 illustrates the substrate of FIG. 6 after an additional oxide layer has been formed.

Next, another oxide layer, again for instance, a CVD, silicon dioxide layer 32 is deposited over the structure of FIG. 6 as shown in FIG. 7. Then, with ordinary anisotropic etching, for instance, with a dry plasma etching process, the layer 32 is etched. Spacers 32 remain from this etching, vertically disposed on the sides of the pedestal 28. Thus, a pedestal structure includes the emitter pedestal 28, the sidewall spacers 32, and the underlying region 25 which defines an opening for the emitter, as best shown in FIG. 8.

Now, isotropic etching is used to etch the epitaxial layer 23 in alignment with the spacers 32. This again may be a plasma etching process. An etchant that discriminates between the oxide and silicon is used. This results in a thinning of the epitaxial layer 23 as shown by the dimension 35 of FIG. 9, and an undercutting of the spacers 32 as shown by the undercut 36 of FIG. 9. Note that during this etching, the hard mask 22 protects the polysilicon pedestal 28. Also note, the oxide regions 25 disposed under the pedestal 28 prevent the formation of a parasitic path between the pedestal and the layer 23. While the undercutting 36 is shown to have a vertical surface, it may be slightly curved, with more of an undercut at the upper section. The etching chemistry may be adjusted to keep this undercut as vertical as possible.

Figure 8:
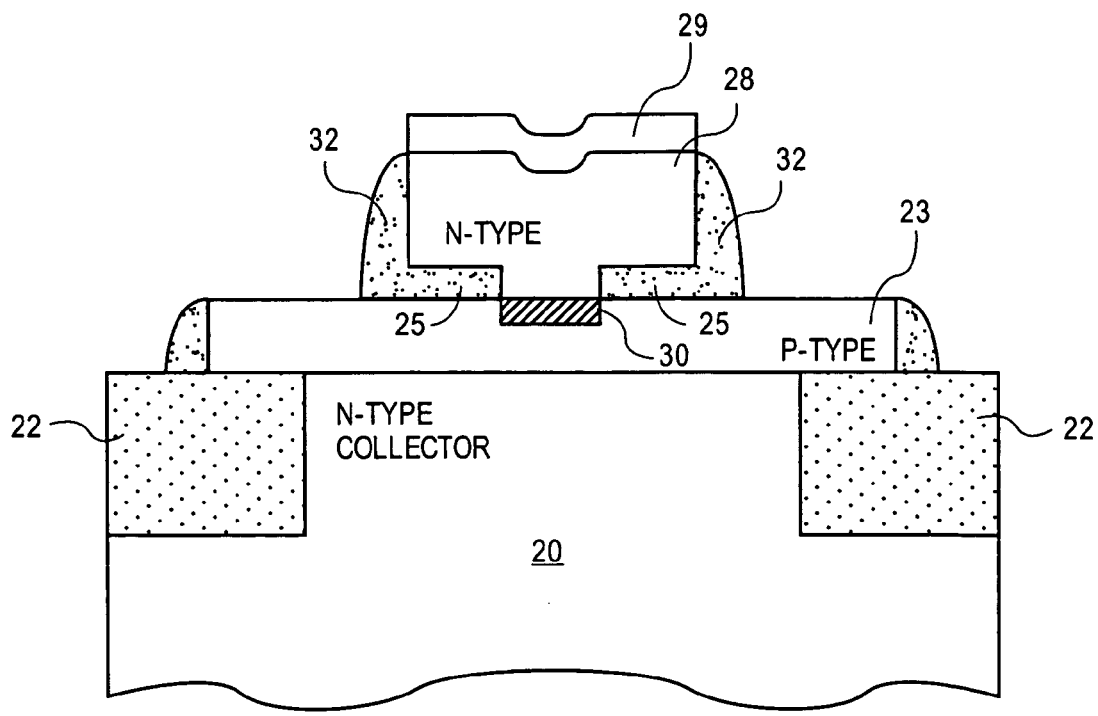
FIG. 8 illustrates the substrate of FIG. 7 after spacers have been formed around the emitter pedestal.
Figure 9:
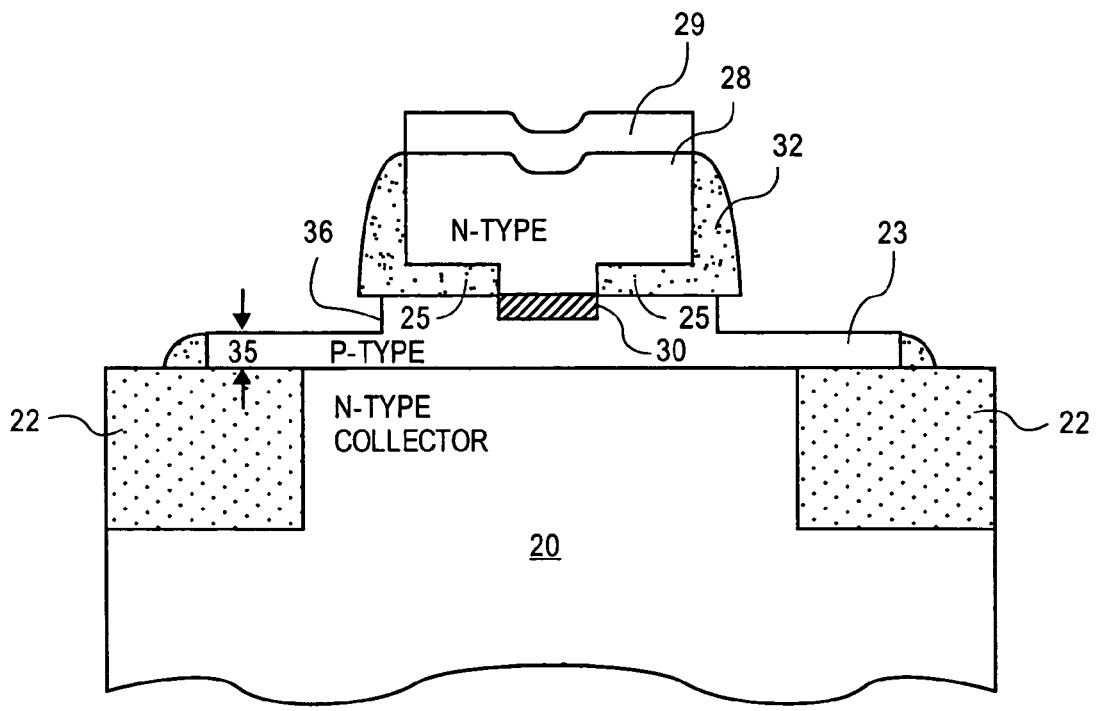
FIG. 9 illustrates the substrate of FIG. 8 after etching of the epitaxial layer including undercutting of the spacers.

While in FIGS. 8 and 9, two separate etching processes have been described, one used to form the spacers 32 and the other to etch the epitaxial layer 23, these may be combined in a single etching chamber. For instance, the gas flows to an etching chamber may be changed after the etching of the oxide layer 32, to cause the silicon of layer 23 to be etched.

Figure 10:
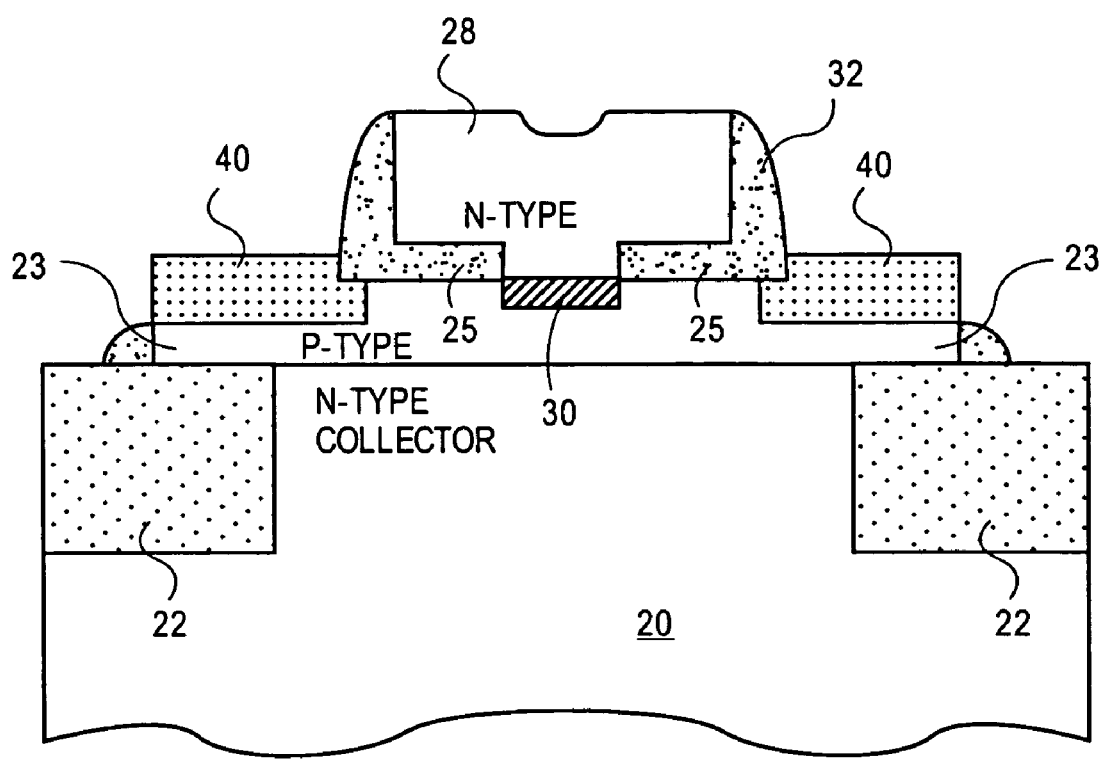
FIG. 10 illustrates the substrate of FIG. 9 after another epitaxial layer has been grown.

As shown in FIG. 10, a second epitaxial layer 40 is now grown over the layer 23. This may be done with a selective formation of an epitaxial layer or the non-selective formation and a subsequent patterning of the second epitaxial layer. In one embodiment, layer 40 is a monocrystalline silicon-germanium layer seeded from layer 23.

The layer 40 is the extrinsic base region for the NPN transistor. Layer 40 is very heavily doped with a P type dopant such as boron. For example, in-situ doping may occur to near the saturation level of the dopant in the silicon-germanium. Doping to a level of $10^{20}$–$10^{21}$ atoms $cm^{-3}$ or greater may be used. The dopant can also be introduced into the layer 40 through ion implantation. Where necessary, the layer 40 can be strained to increase dopant incorporation and enhance the dopant's mobility. Note that the layer 40 also extends into the link base regions.

Importantly, note from FIG. 10, that the extrinsic base thus formed is self-aligned to the emitter polysilicon region 30. Unlike the prior art, there is no lateral extension of the extrinsic base that may approach the emitter region. The regions 25 provide isolation between the layer 40 and the emitter polysilicon of the pedestal 28. Also note that the layer 40 has relative vertical sides and a flat bottom where it engages the layer 23. There is thus, an abrupt transition of doping levels.

A reduction in extrinsic base length of approximately 30% and an overall transistor size reduction of 20% is realized through the self-aligning process described above. By controlling the lateral undercutting 36 of FIG. 9, the thermal cycle and growth conditions for the layer 40, the length of the link base region can be reduced and the height of layer 40 over the original layer 23 can be increased. All of this results in additional reduction in the base resistance.

Thus, an improved bipolar transistor has been described where the extrinsic base is a separately formed epitaxial layer.

What is claimed is:

1. A method for fabricating a bipolar transistor comprising:
   forming an emitter region in a first epitaxial layer;
   etching the first epitaxial layer using an emitter pedestal structure which includes sidewall spacers as a masking member so as to undercut the emitter pedestal structure; and
   after etching the first epitaxial layer, growing a second epitaxial layer on the first epitaxial layer.

2. The method defined by claim 1, wherein a second epitaxial layer is more heavily doped than the first epitaxial layer.

3. The method defined by claim 1, including:
   forming a polysilicon layer on an oxide layer having an opening which exposes the emitter region;
   defining an emitter pedestal from the polysilicon layer; and
   forming oxide sidewall spacers on the emitter pedestal, thereby forming the pedestal structure emitter.

4. The method defined by claim 3, wherein the first epitaxial layer is a silicon-germanium layer.

5. The method defined by claim 4, wherein the second epitaxial layer is a silicon-germanium layer.

6. A method for fabricating a bipolar transistor comprising:
   forming a first epitaxial layer over a collector region;
   forming an emitter region in the first epitaxial layer and an emitter pedestal above the first epitaxial layer;
   forming sidewall spacers on the emitter pedestal over the first epitaxial layer;
   etching the first epitaxial layer including undercutting the sidewall spacers; and
   after etching the first epitaxial layer growing a second epitaxial layer on the first epitaxial layer.

7. The method defined by claim 6, wherein the first and second epitaxial layers are doped with a first conductivity type dopant.

8. The method defined by claim 7, wherein the second epitaxial layer is doped more heavily than the first epitaxial layer with the first conductivity type dopant.

9. The method defined by claim 8, wherein the second epitaxial layer is grown to a level above an upper level of the first epitaxial layer.

10. The method defined by claim 8, wherein the first and second epitaxial layers comprise silicon-germanium.

11. The method defined by claim 6, wherein the emitter pedestal is formed from a polysilicon layer doped with a second conductivity type dopant.

12. The method defined by claim 11, wherein the formation of the emitter region and emitter pedestal includes:
    forming an oxide layer on the first epitaxial layer;
    defining an opening in the oxide layer for the emitter region;
    forming the polysilicon layer over the oxide layer; and
    driving the second conductivity type dopant from the polysilicon layer into the first epitaxial layer to define the emitter region.

13. The method defined by claim 6, wherein the etching comprises use of an isotropic etchant.

14. The method of claim 6, wherein the first epitaxial layer includes the intrinsic base region and at least part of the link based region for the transistor.

15. The method defined by claim 14, wherein the second epitaxial layer comprises the extrinsic base region for the transistor.

* * * * *